(12) United States Patent
Xi et al.

(10) Patent No.: US 11,615,301 B2
(45) Date of Patent: Mar. 28, 2023

(54) LOSSLESS EXPONENT AND LOSSY MANTISSA WEIGHT COMPRESSION FOR TRAINING DEEP NEURAL NETWORKS

(71) Applicant: Microsoft Technology Licensing, LLC, Redmond, WA (US)

(72) Inventors: Jinwen Xi, Sunnyvale, CA (US); Bharadwaj Pudipeddi, San Jose, CA (US); Marc Tremblay, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 853 days.

(21) Appl. No.: 16/559,241

(22) Filed: Sep. 3, 2019

(65) Prior Publication Data

US 2021/0064986 A1 Mar. 4, 2021

(51) Int. Cl.
*G06N 3/08* (2006.01)
*G06F 7/483* (2006.01)
*G06N 3/04* (2006.01)

(52) U.S. Cl.
CPC ............. *G06N 3/08* (2013.01); *G06F 7/483* (2013.01); *G06N 3/04* (2013.01)

(58) Field of Classification Search
CPC .................................. G06N 3/08; G06F 7/483
USPC ......................................................... 706/15
See application file for complete search history.

(56) References Cited

U.S. PATENT DOCUMENTS

| | | | | |
|---|---|---|---|---|
| 10,747,502 | B2* | 8/2020 | Pareek | G06F 9/3887 |
| 10,972,126 | B2* | 4/2021 | Fenney | H03M 7/30 |
| 2019/0156213 | A1* | 5/2019 | Tsuzuku | G06F 17/18 |
| 2019/0370667 | A1* | 12/2019 | Georgiadis | G06N 3/04 |
| 2020/0143226 | A1* | 5/2020 | Georgiadis | G06N 3/0481 |
| 2020/0143249 | A1* | 5/2020 | Georgiadis | G06N 3/082 |
| 2020/0225948 | A1* | 7/2020 | Sim | G06F 9/3001 |
| 2020/0242474 | A1* | 7/2020 | Lo | G06N 3/063 |
| 2020/0264876 | A1* | 8/2020 | Lo | G06K 9/6262 |

OTHER PUBLICATIONS

Gong, et al., "Compressing Deep Convolutional Networks using Vector Quantization", In Repository of arXiv:1412.6115v1, Dec. 18, 2014, 10 Pages.

(Continued)

*Primary Examiner* — Suchin Parihar
(74) *Attorney, Agent, or Firm* — Weaver IP L.L.C.

(57) ABSTRACT

Systems, methods, and apparatuses are provided for compressing values. A plurality of parameters may be obtained from a memory, each parameter comprising a floating-point number that is used in a relationship between artificial neurons or nodes in a model. A mantissa value and an exponent value may be extracted from each floating-point number to generate a set of mantissa values and a set of exponent values. The set of mantissa values may be compressed to generate a mantissa lookup table (LUT) and a plurality of mantissa LUT index values. The set of exponent values may be encoded to generate an exponent LUT and a plurality of exponent LUT index values. The mantissa LUT, mantissa LUT index values, exponent LUT, and exponent LUT index values may be provided to one or more processing entities to train the model.

20 Claims, 5 Drawing Sheets

(56) References Cited

OTHER PUBLICATIONS

Hsu, et al., "A Study on Speech Enhancement Using Exponent-Only Floating Point Quantized Neural Network (EOFP-QNN)", In Proceedings of IEEE Spoken Language Technology Workshop (SLT), Dec. 18, 2018, pp. 566-573.

"International Search Report & Written Opinion issued in PCT Application No. PCT/US2020/036781", dated Sep. 25, 2020, 26 Pages.

Seo, et al., "Efficient Weights Quantization of Convolutional Neural Networks Using Kernel Density Estimation based Non-uniform Quantizer", In Journal of Applied Sciences, vol. 9, Issue 12, Jun. 23, 2019, 13 Pages.

* cited by examiner

LOSSLESS EXPONENT AND LOSSY MANTISSA WEIGHT COMPRESSION FOR TRAINING DEEP NEURAL NETWORKS

BACKGROUND

Modern deep neural networks (DNN) are typically represented by a large number of parameters. Each parameter, which can include weights and/or biases or other parameters, may define a connection between artificial neurons or "nodes" in the network. For complex DNNs that have many layers and nodes within each layer, the number of parameters that make up the DNN can be in the millions or even billions. Each of the parameters are typically represented in a floating-point data format, such as a 32-bit single-precision format in which 8 most significant bits (MSBs) of the 32 bits that represents the parameter value corresponds to an exponent, while 23 least significant bits (LSBs), plus one additional hidden bit, correspond to a mantissa.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Systems, methods, and computer program products are provided for compressing values. A plurality of parameters may be obtained from a memory, each parameter comprising a floating-point number that is used in a relationship between artificial neurons or nodes in a model. A mantissa value and an exponent value may be extracted from each floating-point number to generate a set of mantissa values and a set of exponent values. The set of mantissa values may be compressed to generate a mantissa lookup table (LUT) and a plurality of mantissa LUT index values. The set of exponent values may be encoded to generate an exponent LUT and a plurality of exponent LUT index values. The mantissa LUT, mantissa LUT index values, exponent LUT, and exponent LUT index values may be provided to one or more processing entities to train the machine-learning model.

In this manner, the mantissa and exponent values of a floating-point number may be compressed in an asymmetrical manner, where the compression of the mantissa may be performed using fixed-point values. Furthermore, the exponents may be encoded in a manner that preserves the original exponent values, thereby enabling the encoded exponents to be lossless. Thus, while the compression of mantissa values may be lossy, the lossless encoding of exponent values may still result in an overall loss reduction compared to other techniques.

Further features and advantages, as well as the structure and operation of various example embodiments, are described in detail below with reference to the accompanying drawings. It is noted that the example implementations are not limited to the specific embodiments described herein. Such example embodiments are presented herein for illustrative purposes only. Additional implementations will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate example embodiments of the present application and, together with the description, further serve to explain the principles of the embodiments and to enable a person skilled in the pertinent art to make and use the example embodiments.

Figure 1:
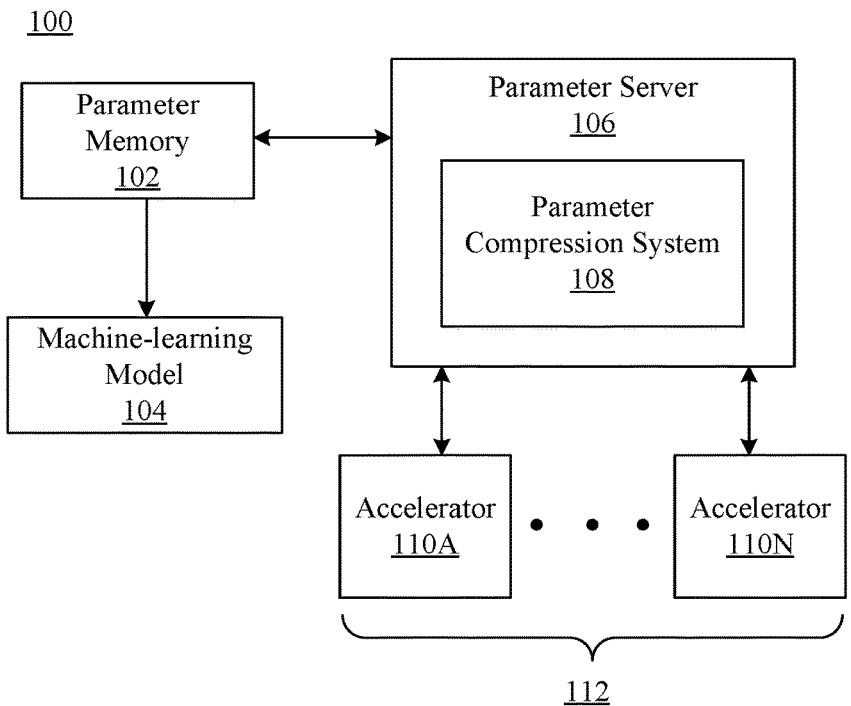
FIG. 1 shows a block diagram of a system for compressing parameter values, according to an example embodiment.

The features and advantages of the implementations described herein will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose numerous example implementations. The scope of the present application is not limited to the disclosed implementations, but also encompasses combinations of the disclosed implementations, as well as modifications to the disclosed implementations. References in the specification to "one implementation," "an implementation," "an example embodiment," "example implementation," or the like, indicate that the implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of persons skilled in the relevant art(s) to implement such feature, structure, or characteristic in connection with other implementations whether or not explicitly described.

In the discussion, unless otherwise stated, adjectives such as "substantially" and "about" modifying a condition or relationship characteristic of a feature or features of an implementation of the disclosure, are understood to mean that the condition or characteristic is defined to within tolerances that are acceptable for operation of the implementation for an application for which it is intended.

Numerous example embodiments are described as follows. It is noted that any section/subsection headings provided herein are not intended to be limiting. Implementations are described throughout this document, and any type of implementation may be included under any section/ subsection. Furthermore, implementations disclosed in any section/subsection may be combined with any other implementations described in the same section/subsection and/or a different section/subsection in any manner.

II. Example Implementations

Modern DNNs are typically represented by a large number of parameters. Each parameter, which can include weights and/or biases or other parameters, may be used in a mathematical relationship between artificial neurons or "nodes" in a model, such as artificial neurons or nodes in a network. For complex DNNs that have many layers and nodes within each layer, the number of parameters that make up the DNN can be in the millions or even billions. Each of the parameters are typically represented in a floating-point data format, such as a 32-bit single-precision format in which 8 MSBs that represents the parameter value corresponds to an exponent, while 23 LSBs (plus one hidden bit) corresponds to mantissa.

In order to train a DNN with sufficient accuracy, multiple iterations are generally required to determine the appropriate values for each parameter in the DNN. Each individual iteration, however, requires processing all of the parameters in the DNN, which not only adds to the delay of training the DNN, but also requires a large amount of system resources (e.g., processing power). One approach to overcome these disadvantages is to compress the parameters prior to transmitting the parameters to an entity responsible for training the DNN. For instance, a clustering-based weight compression method that relies on a floating-point clustering algorithm (e.g. K-means clustering) may be employed where parameter values may be partitioned into different clusters. In this way, each cluster may approximate the parameter values falling under that cluster with a single value, and only those values may be transmitted to the training entities instead of the actual parameter values. However, such an approach requires a significantly large amount of FLOPs, which can still comprise a large overhead in terms of processing and/or computing resources. Furthermore, such a clustering algorithm is also iterative, and can potentially require hundreds of iterations in order to sufficiently converge when the value of K is large.

Implementations described herein address these and other issues through a system for compressing values. In an example system, a floating-point number separator may obtain a plurality of parameters (e.g., a weight matrix or the like) from a parameter memory, each parameter comprising a floating-point number that is used in a mathematical relationship between artificial neurons or nodes in a model. The floating-point separator may extract a mantissa value and an exponent value from each floating-point number to generate a set of mantissa values and a set of exponent values. A mantissa compressor may compress the set of mantissa values to generate a mantissa LUT and a plurality of mantissa LUT index values, each parameter being assigned one of the plurality of mantissa LUT index values. An exponent encoder may encode the set of exponent values to generate an exponent LUT and a plurality of exponent LUT index values, each parameter being assigned one of the plurality of exponent LUT index values. A compressed parameter communicator may provide the mantissa LUT, mantissa LUT index values, exponent LUT, and exponent LUT values to at least one processing entity to train a model (e.g., machine-learning model, such as a DNN).

This approach has numerous advantages, including but not limited to increasing the efficiency at which machine learning models, including DNNs, may be trained. For instance, separating floating-point parameters, such as values of a weight matrix, into a fixed-point mantissa and an integer exponent as described herein may enable compression based on the statistical properties of the separated values independently. In other words, exponent integers may be encoded in a manner that is lossless, while the mantissa values (which may be a decimal with a limited range greater than or equal to 1, but less than 2) may be compressed using fixed-point arithmetic operations. For instance, the mantissa values may be compressed using a fixed-point clustering algorithm that has less processing complexity than floating-point clustering algorithms, thereby enabling a reduction in latency, area, and power when compressing weights. Furthermore, clustering the mantissa using a fixed-point clustering algorithm (versus a floating-point algorithm in which all operations need to be carried out in the floating-point domain) may be performed with less iterations, thereby further increasing the efficiency at which values may be compressed.

Even further, since compression may be carried out in a quicker manner with a reduction in resources, compressed values may be transmitted to processing entities in a quicker fashion, thereby speeding up the rate at which the processing entities can perform operations to train a machine learning model. For instance, in large models where millions or even billions of parameters are present, transmission of uncompressed parameters may cause a bottleneck in the training procedure, as accelerators often can process parameters quicker than those parameters are transmitted. In other words, the communication of uncompressed parameters typically takes longer than the computation time using those parameters at the accelerators. With implementation of the techniques described herein, the parameters may be compressed in a manner that reduces the overall number of values to transmit while still retaining sufficient accuracy. In many cases, the number of compressed values may be a fraction of the number of uncompressed values. As a result, the communication time of the parameters between a compressing entity (e.g., a parameter server) and each of the accelerators may be reduced, thereby improving the overall performance and efficiency of the system.

Still further, compressing values in accordance with techniques described herein may also enable a reduction in compression losses compared to other techniques. For instance, since exponents may be encoded in a lossless fashion, decoding the exponents to obtain original exponent values do not introduce any error. As a result, when the parameter values are restored (e.g., by generating a decompressed weight matrix) by combining the decoded exponent and decompressed mantissa (which may be lossy depending on the compression techniques utilized), the overall resulting error may be less when compared to existing techniques. As a result, smaller degradation may exist during the training of a machine-learning model (e.g., a DNN), potentially reducing the number of iterations during training.

Example implementations will now be described that are directed to techniques for compressing values. For instance, FIG. 1 shows a block diagram of an example system 100 for compressing parameter values, according to an example implementation. As shown in FIG. 1, system 100 includes a parameter memory 102, a machine-learning model 104, a parameter server 106, and one or more accelerators 110A-110N. Accelerators 110A-110N may collectively be referred to as accelerators 112.

Machine-learning model 104 may comprise any type of model that may be trained based on a set of training data to make predictions based on additional data. In example embodiments, machine-learning model 104 may include one or more of an artificial intelligence (AI) model, a neural network such as an artificial neural network (ANN) and/or a deep neural network (DNN), or any other network which may comprise a plurality of layers that connect input variables or features with output layers. In examples, a neural network learning algorithm may be used to generate and/or train machine-learning model as a neural network that is an interconnected group of artificial neurons, also referred to as nodes of the neural network. Although some example embodiments may be described herein with respect to machine-learning model 104 comprising a DNN, such embodiments are not intended to be limiting, and may include any other type of model described herein.

A neural network may be represented by a plurality of parameters stored in parameter memory 102. Parameter memory 102 may be configured to store a master copy of the parameters that represent machine-learning model 104. For instance, parameter memory 102 may include a plurality of weights, gradients, biases, hyperparameters, etc. that may describe how different nodes of machine-learning model 104 may be mathematically related to each other. Parameter memory 102 may also include other data structures, such as an activation stash that may exist as a storage space for accelerators 112 using during training.

In examples, training machine learning model 104 may be carried out in various ways. In one implementation, machine learning model 104 may comprise a matrix (or a set of matrices) that include the parameters representing the model. Before training is performed, each element in the matrix may be assigned a value between 0 and 1 at random and/or based on estimations that may not necessarily be accurate. Parameter server 106 may be configured to obtain the matrices (which include the parameters) from parameter memory 102 and provide the parameters to accelerators 112. Each of the accelerators 112 may process a portion of the set of parameters assigned to the respective accelerator and determine a gradient (e.g., an error value corresponding to each parameter) and back propagate the gradient to update the parameter values (e.g., updating the weights and/or biases). In some example embodiments, this process may be repeated until the model is deemed to have converged sufficiently (e.g., the error level is under a desired threshold), at which point machine learning model 104 may be considered trained.

Parameter values stored in parameter memory 102 may comprise floating-point values in example embodiments. For instance, parameter values may be stored in accordance with one or more precision levels under The Institute of Electrical and Electronics Engineers Standard for Floating-Point Arithmetic (IEEE 754), including but not limited to half-precision, single-precision, and/or double precision. Half-precision floating-point values may comprise 16-bits, with one bit representing the sign of the value (e.g., positive or negative), 5 bits representing the exponent of the value, and 10 bits representing the mantissa of the value. Single-precision floating-point values may comprise 32 bits, with one bit representing the sign of the value, 8 bits representing the exponent, and 23 bits representing the mantissa. Double-precision floating-point values may comprise 64 bits, with one bit representing the sign of the value, 11 bits representing the exponent, and 52 bits representing the mantissa. Implementations are not limited to these particular examples, but may include any other floating-point format comprising a mantissa and an exponent.

In examples, parameter memory 102 may comprise one or more memory devices that are external or internal to parameter server 106. For instance, parameter memory 102 may be located remotely (e.g. on a cloud storage), or co-located, or may comprise an off-chip and/or on-chip memory of parameter server 106. Examples of such storage devices include hard disk drives, solid state drives, random access memory (RAM) devices, etc. In some implementations, parameter memory may comprise a plurality of memory devices that include a combination of one or more types of memory devices described herein.

As shown in FIG. 1, parameter server 106 may comprise a parameter compression system 108. Parameter server 106 may be configured to coordinate training of machine-learning model 104 using accelerators 112. Parameter server 106 may comprise any one or more processing entities, such as a central processing unit (CPU), a graphics processing unit (GPU), a field-programmable gate array (FPGA), or any other processor (or computing device including one or more of such processors) that may obtain parameters from parameter memory 102 and provide the parameters to accelerators 112 for training machine-learning model 104. Although it is shown in FIG. 1 that parameter server 106 may comprise a stand-alone system or a single entity, this depiction is illustrative only and not intended to be limiting. Parameter server 106 may comprise any type or combination of processing entities, whether stand-alone or distributed across a plurality of other processing entities (not shown). An example computing device that may incorporate the functionality of parameter server 106 (and/or other components of system 100) is discussed below in reference to FIG. 7.

In implementations, when model 104 is being trained, parameter server 106 may obtain parameters from parameter memory 102 (e.g., in a floating-point format) to provide to accelerators 112. As discussed in greater detail below, parameter compression system 108 may be configured to compress the obtained parameter values in a manner that may reduce the overall amount of data transmitted to accelerators 112. As a result, the amount of bandwidth required for each communication channel between parameter server 106 and each of accelerators 110A-110N may be reduced, thereby increasing the speed and efficiency at which accelerators 112 may process the received parameters. In other words, parameter compression system 108 may allow for the transmission of parameters (e.g., weights and/or biases) from parameter memory 102 to accelerators 112 in a quicker fashion. Not only does the transmission of compressed parameters to accelerators 112 provide benefits in larger models that have millions or even billions of parameters, the reduction in bandwidth provides efficiency benefits to various types of parameter server configurations, including a multiple-accelerator configurations where distributed training may be implemented as shown in FIG. 1, or a single accelerator configuration (not expressly illustrated).

Accelerators 112 may train machine-learning model 104 in various ways. For instance, as shown in FIG. 1, a distributed training configuration may be utilized in which a plurality of accelerators 110A-110N (also referred to as "workers") may obtain compressed parameters from parameter server 106 over a plurality of communication channels. In such examples, the compressed parameters may include weights and/or biases, and accelerators 112 may execute a training algorithm using such parameters to train machine-learning model 104. Each of accelerators 110A-110N may comprise one or more hardware accelerators, such as a GPU, FPGA, application-specific integrated circuit (ASIC), or any other processing entity that may be configured and/or optimized for arithmetic operations used in training a machine-learning model such as a neural network. For instance, such processing entities may comprise hundreds, or even thousands of processing cores that may be optimized to carry out arithmetic functions.

In some implementations, such as where multiple accelerators are utilized, each accelerator may be assigned a particular batch or chunk of parameters to process (e.g., based on layers in the neural network, or any other distribution as appreciated by those skilled in the relevant arts). Upon processing the parameters through the neural network, accelerators 112 may generate a level of error (e.g., a gradient) for each parameter that may be provided to parameter server 106. Parameter server 106 determine updated parameter values based on the gradients (e.g., using weight accumulation, weight optimization, and/or other appropriate techniques) and retransmit the updated weights to accelerators 112 for the next iteration. In some implementations, parameter server 106 may also be configured store the updated parameters in parameter server 102. Such a process (e.g., receiving compressed parameters by accelerators 112, providing gradients to parameter server 106, determining updated parameters at parameter server 106) may be repeated or iterated until an average error level is below a desired threshold. At this point, machine-learning model 104 is deemed to have converged, and the training may be considered complete (at least until additional training data is received).

It is noted that in some implementations, accelerators 112 may process parameters in compressed form (e.g., as compressed by parameter compression system 108). For instance, where accelerators 112 utilize training algorithms (based on software or hardware, or a combination thereof) that may be tuned to operate on compressed parameters, techniques described herein may further enhance the overall performance of the system, especially where certain processing entities (e.g., GPUs) may not be optimized to perform weight compression. In such instances, accelerators 112 may receive compressed parameters, including compressed weights and/or biases, from parameter server 106 utilize homomorphic algorithms or other algorithms where the parameters are used without decompressing. In other implementations, accelerators 112 may be configured to decompress only a subset of the compressed parameters, while performing other operations on the compressed parameters. In each scenario, however, the overall system may operate to accelerate execution in a highly memory efficient manner.

Furthermore, it is understood that any of the components illustrated in FIG. 1 may be coupled to each other, and to other entities not expressly shown via a bus, network, or other communication channel. For instance, a network may comprise one or more networks such as local area networks (LANs), wide area networks (WANs), personal area network (PANs), enterprise networks, the Internet, etc., and may include wired and/or wireless portions. In an implementation, the components illustrated in FIG. 1 may communicate via one or more application programming interfaces (API), and/or according to other interfaces and/or techniques. Any one or more of such components may each include at least one network interface that enables communications with each other. Examples of such a network interface, wired or wireless, include an IEEE 802.11 wireless LAN (WLAN) wireless interface, a Worldwide Interoperability for Microwave Access (Wi-MAX) interface, an Ethernet interface, a Universal Serial Bus (USB) interface, a cellular network interface, a Bluetooth™ interface, a near field communication (NFC) interface, etc.

It will be appreciated to those skilled in the relevant arts that implementations are not limited to the illustrative arrangement shown in FIG. 1. For example, any one or more of the components illustrated in FIG. 1 may be implemented on computing devices and/or server devices co-located or located remotely to each other, such as one or more cloud-based server devices or a cloud-based computing platform. For instance, one or more components illustrated in FIG. 1 may be executed or located in a cloud (e.g., on one or more cloud-based servers). In some other implementations, such as in an "AllReduce" configuration, a centralized parameter server may not be present, but instead each accelerator may comprise a separate copy (or portion thereof) of the parameters stored in parameter memory 102. Other configurations are also contemplated, including a combination of any of the aforementioned arrangements in which a parameter server may compress parameters prior to transmitting the parameters to one or more accelerators, or any other entity other than a parameter server may compress parameters in a similar manner as described herein.

Figure 2:
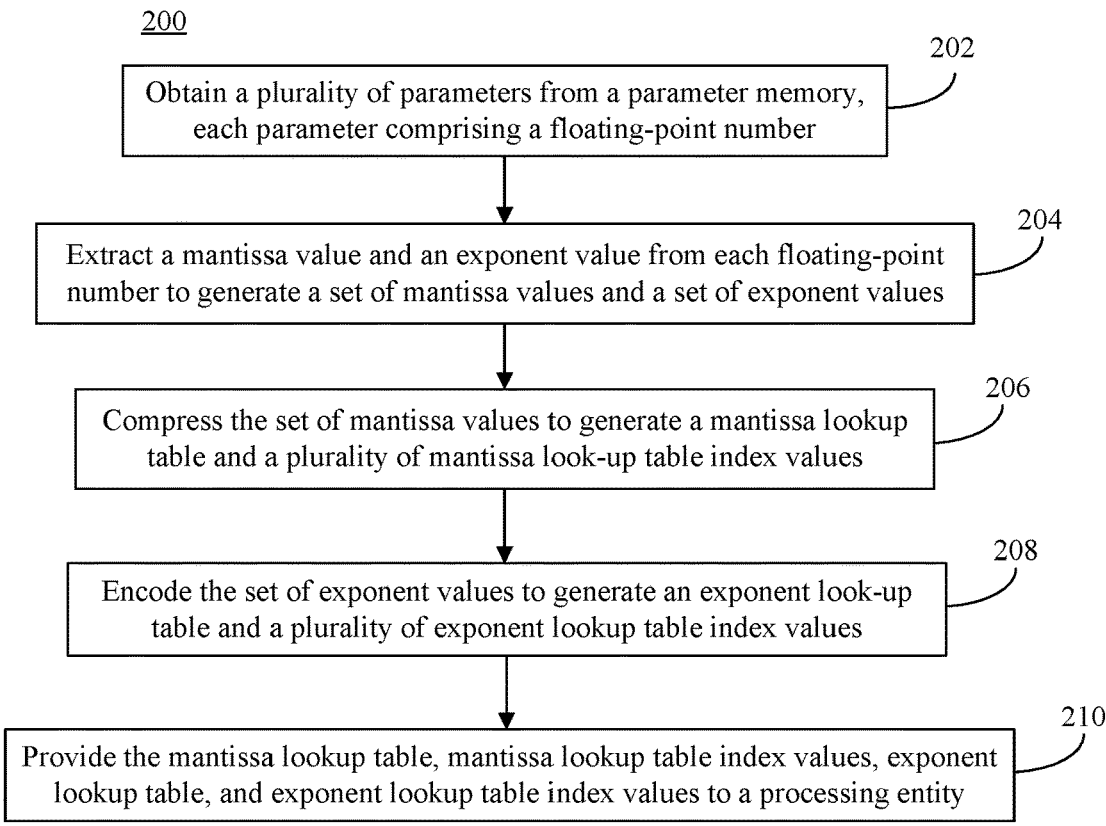
FIG. 2 shows a flowchart of a method for training a model using compressed parameter values, according to an example embodiment.
Figure 3:
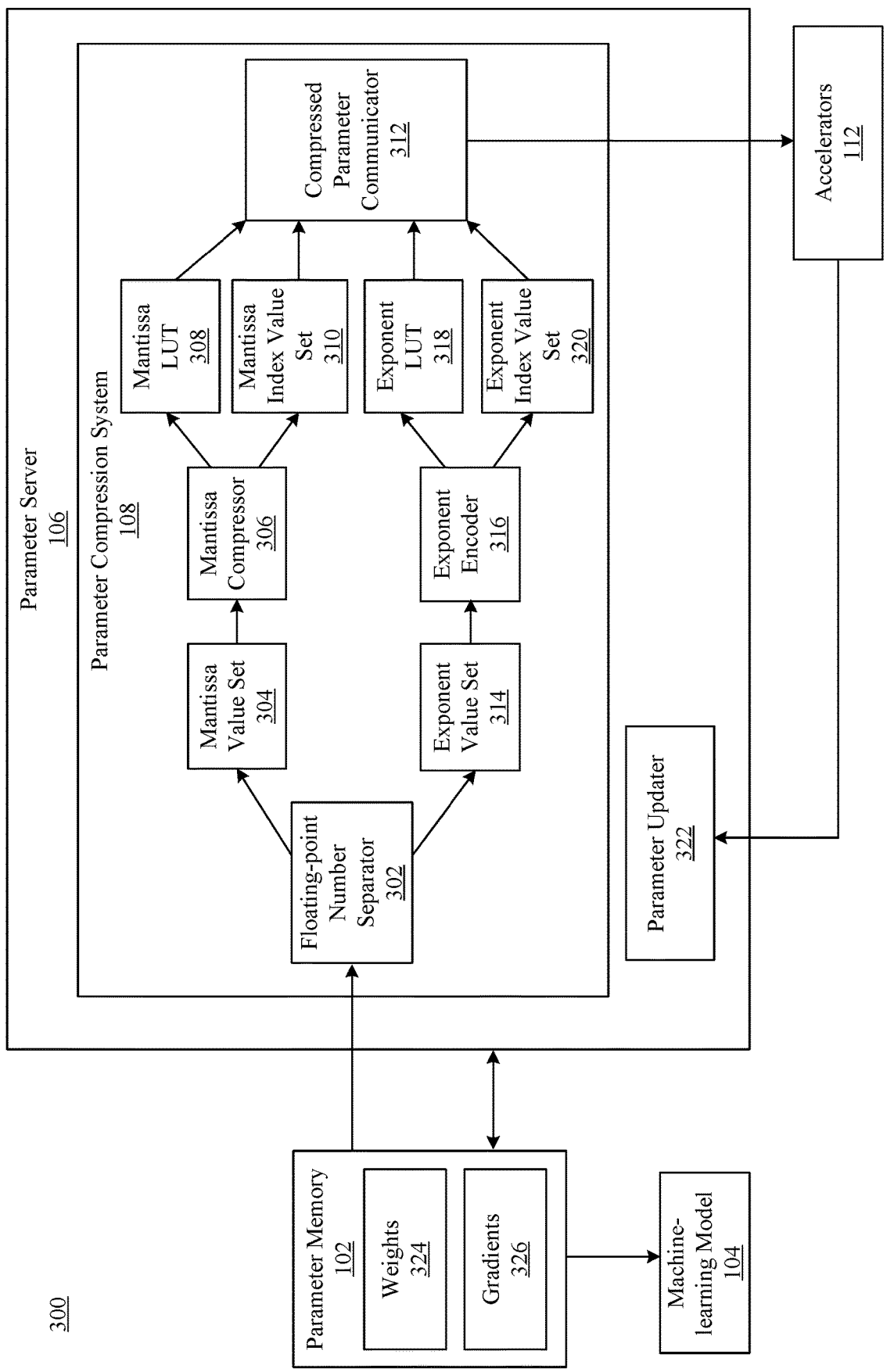
FIG. 3 shows a block diagram of a parameter compression system, according to an example embodiment.

Accordingly, in implementations, compressing parameter values to train a machine-learning model may be achieved in various ways. For example, FIG. 2 shows a flowchart 200 of a method for training a machine-learning model using compressed parameter values, according to an example embodiment. In an implementation, the method of flowchart 200 may be implemented by parameter compression system 108. For illustrative purposes, flowchart 200 and content overlay engine 104 are described as follows with respect to FIG. 3. FIG. 3 shows a block diagram of a parameter compression system, according to an example embodiment. As shown in FIG. 3, system 300 includes an example implementation of parameter memory 102, machine-learning model 104, parameter server 106, and accelerators 112. Parameter memory 102 includes weights 324, and gradients 326. Parameter server 106 includes parameter compression system 108 and a parameter updater 322. As shown in FIG. 3, parameter compression system 108 includes a floating-point number separator 302, a mantissa value set 304, a mantissa compressor 306, a mantissa lookup table 308, a mantissa index value set 310, a compressed parameter communicator 312, an exponent value set 314, an exponent encoder 316, an exponent lookup table 318, and an exponent index value set 320. Flowchart 200 and system 300 are described in further detail as follows.

Flowchart 200 begins with step 202. In step 202, a plurality of parameters are obtained from a parameter memory, each parameter comprising a floating-point number. For instance, with reference to FIG. 3, floating-point number separator 302 may be configured to obtain a plurality of parameters from parameter memory 102. Parameter memory 102 may include weights 324 that are used in a relationship between artificial neurons or nodes in a model, such as machine-learning model 104. For instance, weights 324 may comprise a plurality of values (such as a matrix or a plurality of matrices) that include numerical values indicating how a particular node of one layer of machine-learning model 104 may be mathematically related to another node in a different layer. Examples of such weights 324 may includes weights and/or parameters that may be used to train and/or represent a DNN.

In implementations, weights 324 may comprise a plurality of floating-point numbers based at least on a combination of an exponent and a mantissa. In other words, the value of each of weights 324 may be represented as:

$$w = mw * 2^{ew}$$

where w represents the numerical weight value, mw represents the mantissa value, and ew represents the exponent value. In many implementations, such as where weights 324 are stored in a single-precision format, the value of mw is greater than or equal to 1 but less than 2, and the value of ew is between −128 to +127. It is understood, however, that the particular formats described are not intended to be limiting. Example embodiments may be implemented for any suitable floating-point format (e.g., where mw may comprise or be normalized to a different range of values, ew has a larger or smaller range, etc.).

In examples, therefore, each of weights 324 may include a sequence of bits that may be partitioned where one portion represents the exponent (ew), and another portion represents a mantissa (mw). In some further examples, an additional bit may comprise a signed bit that indicates whether a particular weight value is a positive or a negative number. As described earlier, weights 324 may comprise any one or more formats with any appropriate degree of precision, such as a half-precision floating-point format (e.g., 16 bits), single-precision floating-point format (e.g., 32 bits), double-precision floating-point format (e.g., 64 bits), or any other suitable floating-point format.

In step 204, a mantissa value an exponent value are extracted from each floating-point number to generate a set of mantissa values and a set of exponent values. For instance, with reference to FIG. 3, floating-point number separator 302 may be configured to separate portions of the data of that represent each of weights 324 (e.g., in a floating-point format) to extract a mantissa value and an exponent value. For instance, where weights 324 each comprise a single-precision floating-point number that is 32 bits in length (also referred to herein as FP32), the mantissa value may be extracted as a fixed-point number that is 24 total bits long in the format s1.23, which comprises a signed integer bit "1.23" represents a value within a range greater than or equal to 1 and less than 2. In other words, the "1" may represent an integer value of the number before decimal point, while the "23" represents the 23-bit fractional portion following the decimal point. In implementations, therefore, value of the "1.23" portion therefore comprises a limited range greater or equal to 1, and less than 2. In this example, the 24-bit mantissa value (e.g., which includes the numbers both before and after the decimal point) can be further processed (described in detail below) as a 24-bit fixed-point number. Because of the relatively limited range of the 24-bit fixed point number that represents the mantissa value, the extracted mantissa value therefore may comprise a range of values that is less than the full range representable in the FP32 format (e.g., the full range as calculated by combining the mantissa and exponent values).

In examples, floating-point number separator 302 may be configured to extract the mantissa value as described for each of the weight values 324 to generate mantissa value set 304. Stated differently, mantissa value set 304 may comprise a plurality of mantissa values (e.g., in a matrix or a plurality of matrices) that may be extracted for each of weights 324.

As described above, floating-point number separator 302 may extract an exponent value from a floating-point number. In some implementations, floating-point number separator 302 may extract the mantissa value as described above and the exponent value in parallel with each other to further reduce the latency. In other words, where floating-point number separator 302 may utilize different hardware components to extract the mantissa exponent values. For instance, in the FP32 format, the exponent portion of the FP32 value may comprise a sequence of 8 bits. Furthermore, in some formats, such as FP32, the exponent value may also utilize an exponent bias to enable the exponent values to be represented as signed exponent values. For instance, an actual exponent value may be determined by subtracting a predetermined bias value from the 8-bit value. As an example, under the FP32 format, the 8-bit exponent value may comprise a range between 0 and 255. However, since an actual exponent used to calculate a particular weight value is not limited to positive numbers (e.g., between 0 and 255), a bias of 127 may be employed and subtracted from the 8-bit value to enable a range between −128 and +127.

Thus, in examples, the exponent value extracted by floating-point number separator 302 may similarly comprise a range of −128 and +127 using such a predetermined bias. As a result, each exponent value extracted by floating-point number separator 302 may comprise a limited range of integer values.

Floating-point number separator 302 may be configured to extract the exponent value as described for each of the weight values 324 to generate exponent value set 314. Similar to mantissa value set 304, exponent value set 314 may comprise a plurality of exponent values (e.g., in a matrix or plurality of matrices) corresponding to each of weights 324.

In step 206, the set of mantissa values is compressed to generate a mantissa lookup table and a plurality of mantissa lookup table index values, each parameter being assigned one of the plurality of mantissa lookup table index values. For instance, with reference to FIG. 3, mantissa compressor 306 may obtain mantissa value set 304 and compress the set of mantissa values to generate mantissa LUT 308 and mantissa index value set 310.

Mantissa compressor 306 may compress the set of mantissa values in various ways. In one example, mantissa compressor 306 may implement a clustering-based algorithm (e.g., K-means clustering), in which the values from mantissa value set 304 may be partitioned into a plurality of K clusters, each cluster comprising a cluster centroid that represents all of the mantissa values of mantissa value set 304 falling under that cluster. In such an example, the each of the cluster centroids may be provided in mantissa LUT 308, where each cluster centroid in the LUT is assigned a LUT index value. In addition, mantissa index value set 310 may comprise, for each parameter (e.g., each of weights 324) an assignment of a particular cluster centroid (i.e., a value in mantissa LUT 308) by assigning each parameter the appropriate mantissa LUT index value. In this manner, each individual mantissa value of mantissa value set 304 may be determined by identifying the LUT index value for the mantissa value from mantissa index value set 310, and obtaining the appropriate cluster centroid from mantissa LUT 308 corresponding to the LUT index value. Other compression techniques are also contemplated, including but not limited to sparsity-based compression, precision-based compression, or any other technique appreciated to those skilled in the relevant arts.

In step 208, the set of exponent values are encoded to generate an exponent lookup table and a plurality of exponent lookup table index values, each parameter being assigned one of the plurality of exponent lookup table index values. For instance, with reference to FIG. 3, exponent encoder 316 may encode exponent value set 314 to generate exponent LUT 318 and exponent index value set 320.

Because the exponent values across exponent value set 314 comprise a limited range of values (e.g., between −128 and +127 for weights in the FP32 format), exponent encoder 316 may encode exponent value set 314 in a manner that is lossless.

For instance, exponent encoder 316 may be configured to generate a histogram of exponent values in exponent value set 314 to identify all of the unique exponent values in the set. Exponent encoder 316 may assign an exponent LUT index value to each of the unique exponent values, and store the LUT index value and associated unique exponent value in exponent LUT 318. For example, where the exponent value (ew) extracted by floating-point number separator 302 is an 8-bit value, a histogram, h_ew, may be generated identifying all possible ew values across exponent value set 314. In this example, exponent LUT 318 may comprise the h_ew values that indexed by a $\log_2$(h_ew)-bit index value, and each parameter's individual exponent value (stored in exponent index value set 320) may be represented by the appropriate $\log_2$(h_ew)-bit vector. In this manner, the original exponent value corresponding to each parameter may be determined by obtaining the exponent LUT index value (with a length of $\log_2$(h_ew)-bits) assigned to the parameter from exponent index value set 320, and looking up the exponent value in exponent LUT 318 using the obtained exponent LUT index value. It is noted and understood that exponent encoder 316 is not limited to encoding the exponents using a histogram of exponents as described. For instance, other techniques may also be implemented, such as encoding exponent value set 314 using one or more other encoding methods that is similarly lossless.

For many machine-learning models, the actual number of unique exponent values extracted across all of the parameters is typically one or more orders of magnitude less than the full range of possible exponent values. For instance, in an FP32 format where the full range of exponent values may be any number between −128 and +127, exponent encoder 316 may identify a smaller number of unique values that were actually extracted across the parameters. In some scenarios, the number of unique values may not exceed 16 discrete or distinct integer values. In those scenarios, exponent encoder 316 may encode the exponent value set 314 to generate exponent LUT 318 that comprises the unique exponent values (less than 16 values), with the corresponding number of index values. As a result, each parameter's exponent value in this type of scenario may be represented by a 4-bit exponent LUT index value (or less) that identifies the particular exponent value for the parameter. Because exponent encoder 316 stores all the unique exponent values in exponent LUT 318 (instead of an approximated or averaged value), the exponent value is lossless. In other words, the dynamic range of the exponent value before and after the encoding is preserved, thereby enhancing the integrity of the exponent values during compression. Furthermore, since exponent encoder 316 may be configured to encode exponent value set 314 in the fixed-point domain using only integer values, exponent encoder 316 may be implemented in hardware with a relatively small gate count.

Accordingly, rather than compressing parameters in the floating-point domain, which requires a large number of floating-point operations that can be processor intensive, implementations described herein provide for compressing the mantissa values using a first technique (e.g., a clustering-based compression), and encoding the exponents using a second technique (e.g., encoding the exponents in a lossless fashion), both of which occur in a fixed-point domain. As a result, compressing parameters may be carried out quicker and with less processing resources (e.g., a reduction in the overall number of gates in a hardware implementation). Furthermore, since different data statistics of mantissas and exponents across weights 324 may be exploited separately as described herein, an overall more efficient weight compression solution may be attained.

Still further, since exponent encoder 316 is configured to encode the exponents in a lossless fashion as described above, the overall accuracy of the parameters following compression is increased compared to other techniques. Still further, because mantissa compressor 306 may compress mantissas independently from exponent encoder 316 encoding the exponents, mantissa compressor 306 may compress mantissa value set 304 in parallel with exponent encoder 316 encoding exponent value set 314, thereby further enhancing the efficiency of parameter compression system 108 and reducing the overall latency.

Although it is illustrated herein that mantissa compressor 306 may generate mantissa LUT 308 and mantissa index value set 310 in step 206, and exponent encoder 316 may generate exponent LUT 318 and exponent index value set 320 in step 208, the arrangement and/or ordering of steps is not intended to be limiting in any way. For instance, mantissa compressor 306 may generate mantissa LUT 308 and mantissa index value set 310 using a first set of hardware resources (e.g., processing components), and exponent encoder 316 may generate exponent LUT 318 and exponent index value set 320 using a second set of hardware resources different from the first set. In this manner, mantissa compressor 306 may generate mantissa LUT 308 and mantissa index value set 310 in parallel with exponent encoder 316 generating exponent LUT 318 and exponent index value set 320 to further reduce the processing time and the overall compression latency. In other examples, mantissa compressor 306 may execute after exponent encoder 316 executes. Accordingly, steps 206 and 208 may be performed at the same time as each other or may be performed out of order without departing from the scope of the disclosure.

In step 210, the mantissa lookup table, mantissa lookup table index values, exponent lookup table, and exponent lookup table values are provided to at least one processing entity to train the model. For instance, with reference to FIG. 3, compressed parameter communicator 312 may be configured to transmit mantissa LUT 308, mantissa index value set 310, exponent LUT 318, and exponent index value set 320 to accelerators 112 to train machine learning model 104. For each received compressed parameter, accelerators 112 may decompress the parameter by looking up the appropriate cluster centroid in mantissa LUT 308 based on the mantissa index value, and looking up the exponent value based on the exponent index value. By combining the mantissa value and the exponent value as described earlier, a decompressed weight value may be determined. Upon determining the decompressed weight value for each parameter, accelerators 112 may process the weight values through the machine-learning training algorithm to train machine-learning model 104.

In some examples, as described above, accelerators 112 (comprising a plurality of accelerators 110A-110N) may be configured to train machine-learning model 104 based on a portion of parameters assigned to the accelerator. For instance, each of a plurality of accelerators may receive a portion of the compressed parameters from compressed parameter communicator 312, reconstruct decompressed parameters therefrom, and process the decompressed parameters through a neural network that is being trained. Upon processing the set of parameters through the network, a gradient (e.g., error value) for each parameter may be determined and back propagated to update the parameters in parameter memory 102. In other words, accelerators 112 may be configured to provide the determined gradients to parameter updater 322, which may then cause weights 324 in parameter memory 102 to be adjusted appropriately. Such a process may be iterated a plurality of times until an overall level of error is under a desired threshold, at which point machine-learning model 104 may be considered trained.

In some examples, such as where machine-learning model 104 comprises a DNN (or other similar types of neural networks), accelerators 112 may be configured to utilize a machine-learning algorithm to determine the appropriate mathematical manipulations for each node of each layer in order to accurately map an input to a desired output. For instance, the DNN may be configured to assign numerical values to each of the connections between individual artificial neurons in the network based on the decompressed parameters. If the DNN did not map the input to the desired output with sufficient accuracy, the training algorithm may determine one or more gradients to alter the decompressed parameters until an accurate mapping is obtained.

It is noted and understood that although it is described that the techniques may be carried out for training a machine-learning model, implementations are not limited. The disclosed embodiments of compressing mantissa values using one technique (e.g., a clustering-based compression technique) and encoding the exponents with another technique (e.g., in a lossless fashion) may be performed in other data processing implementations as well, where number representations can tolerate lossy compression. For instance, techniques described herein may be utilized for image compression, video compression (or any other graphics processing techniques where compression may be used), audio compression, or any other compression-based schemes as appreciated to those skilled in the relevant arts.

Figure 4:
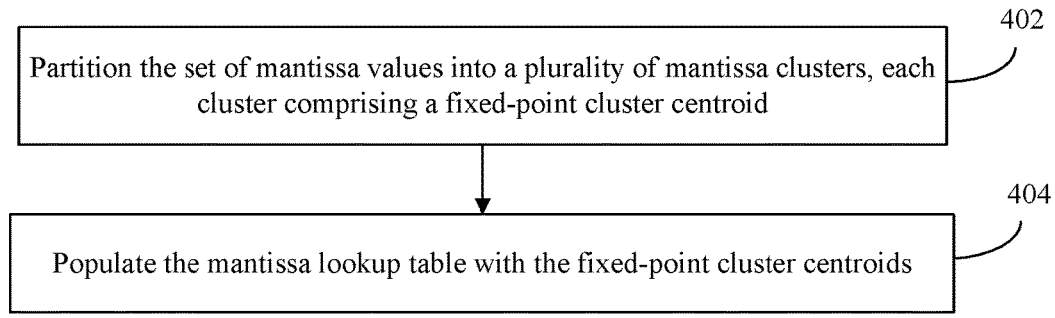
FIG. 4 shows a flowchart of a method for partitioning the set of mantissa values into a plurality of mantissa clusters, according to an example embodiment.

As described above, in examples, mantissa compressor 306 may compress mantissa value set 304 in various ways. For instance, FIG. 4 shows a flowchart 400 of a method for partitioning the set of mantissa values into a plurality of mantissa clusters, according to an example embodiment. In an example, the method of flowchart 400 may be implemented by mantissa compressor 306, as shown in FIG. 3. Other structural and operational implementations will be apparent to persons skilled in the relevant art(s) based on the following discussion regarding flowchart 400 and system 300.

Flowchart 400 begins with step 402. In step 402, the set of mantissa values is partitioned into a plurality of mantissa clusters, each cluster comprising a fixed-point cluster centroid. For instance, with reference to FIG. 3, mantissa compressor 306 may be configured to obtain mantissa value set 304 and partition the value set into a plurality of mantissa clusters. Each of the mantissa clusters may comprise, for instance, a fixed-point cluster centroid that comprises an approximate or average value for all of the mantissa values partitioned into that particular cluster.

As an illustrative example, if a machine-learning model comprised 1000 different parameters in a floating-point format (though such a number may be much larger with many machine-learning models), floating-point number separator 302 may therefore extract 1000 mantissa values from the set of parameters to generate mantissa value set 304. Mantissa compressor 306 may partition the 1000 mantissa values of mantissa value set 304 into an appropriate number of mantissa clusters. As an example, if mantissa compressor 306 may partitioned the 1000 mantissa values into 4 clusters, each cluster could be associated with approximately 250 mantissa values of mantissa value set 304 (though that number may be higher or lower for any given cluster, depending on the actual data statistics). In such an example, each cluster may comprise a cluster centroid that is an average of all the mantissa values (e.g., 250 values) falling under that cluster.

In step 404, a mantissa lookup table is populated with the fixed-point cluster centroids. For instance, with reference to FIG. 3, mantissa compressor 306 may populate mantissa LUT 308 with each of the fixed-point cluster centroids. In addition, mantissa LUT 308 may also comprise, for each of the fixed-point cluster centroids, an index value identifying the cluster centroid. The index value may comprise a by $\log_2(K)$-bit index value, where K represents the number of clusters or partitions.

For each parameter from which the mantissa value has been extracted and compressed, mantissa compressor 306 may also identify the appropriate mantissa cluster to which the parameter's mantissa value belongs. For instance, mantissa value index set 310 may indicate (in a matrix or a plurality of matrices) a corresponding $\log_2(K)$-bit index value that is used to identify a particular one of the fixed-point cluster centroids stored in mantissa LUT 308.

Thus, in such an example where an FP32 format is utilized that compresses a total of 32-bits, instead of using 24 bits to represent the mantissa value for a given parameter, the mantissa may be represented by a shorter mantissa index value that identifies which particular entry (i.e., fixed-point cluster centroid) in mantissa LUT 308. In other words, instead of attempting to compress 1000 32-bit floating-point values using expensive floating-point operations in the illustrative example described earlier, implementations enable compressing the mantissa portion of the floating-point values into a much smaller set (e.g., 1000 2-bit index values where only 4 clusters are utilized).

Figure 5:
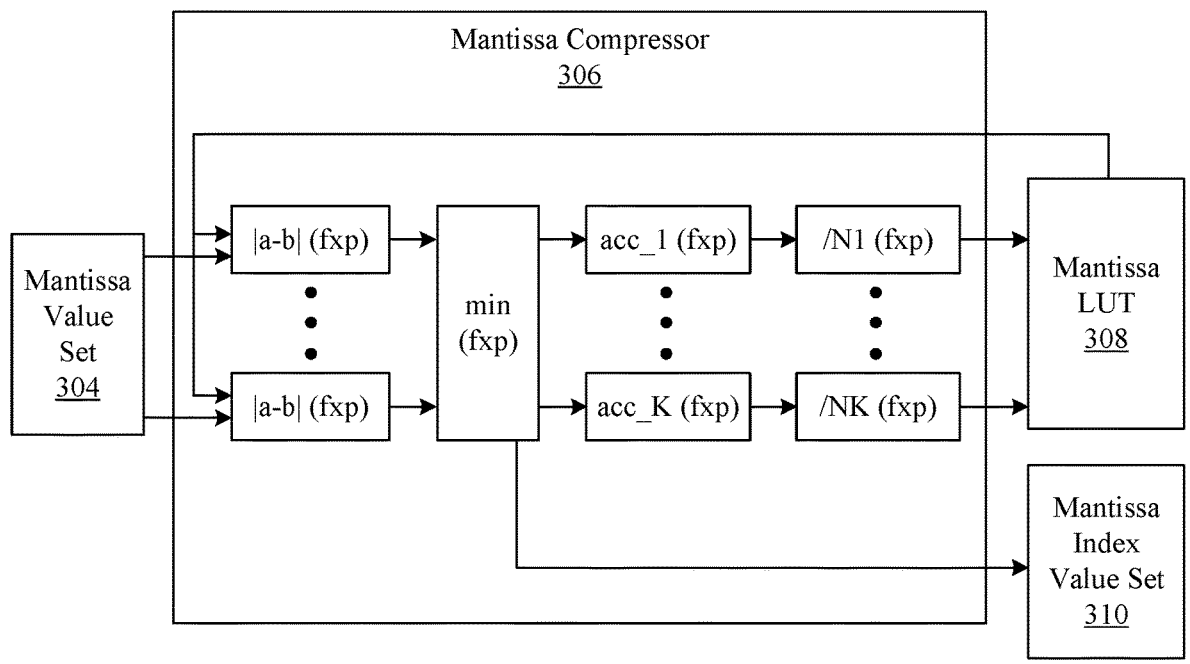
FIG. 5 shows a block diagram of a mantissa compressor, according to an example embodiment.

In some implementations, clustering mantissa value set 304 to generate mantissa LUT 308 and mantissa index value set 310 may be performed in accordance with the system shown in FIG. 5. For instance, FIG. 5 shows a block diagram of a system 500 for compressing mantissa values, according to an example embodiment. System 500 of FIG. 5 includes mantissa value set 304, mantissa compressor 308, mantissa LUT 308, and mantissa index value set 310.

For instance, in FIG. 5, each of the mantissa values may first undergo a comparison with an initial centroid value to determine a distance between the mantissa value and the centroid value. The absolute value of the difference may be determined and provided to the next block, which may determine a minimum distance across the mantissa values. Based on the minimum distance, the mantissa values may be partitioned into K mantissa clusters. An accumulation function is performed which accumulates all of the mantissa values falling under each mantissa cluster. Following the data accumulation, the accumulated sum for each cluster is divided by the number of mantissa values falling under the respective cluster to determine the cluster centroid for the cluster (i.e., the average value). The resulting K cluster centroids may be stored in mantissa LUT 308 that comprises K entries. In some implementation, the cluster centroids may be fed back to the initial distance block and the process may be repeated until the degree of change for each cluster centroid is below a desired threshold value. In other words, once it is determined that the cluster centroids do not change, or change very little, between subsequent iterations, the clustering algorithm may be deemed complete, and the mantissa LUT 308 and the mantissa value index set 310 may be provided to compressed parameter communicator 312 for subsequent transmission to accelerators 112.

Because mantissa value set 304 comprises extracted mantissa values with a limited value range in a fixed-point domain (as opposed to a floating-point domain from which the values were originally extracted), mantissa compressor 306 may perform each of the operations described in FIG. 5 using fixed-point computations, which are quicker and require less processing resources (e.g., less gates in a hardware implementation). For instance, compression in a floating-point domain may require multiple cycles to perform each stage, such as aligning the exponent so that each mantissa value may be processed using the same scale, performing computations in the floating-point domain, shifting back the exponent back to the appropriate format (e.g., FP32), and/or perform other arithmetic operations such as normalization, rounding, etc., each of which can take several cycles to complete for a single iteration. In contrast, since mantissa values set 304 comprises values in the fixed-point domain, each of the operations described in FIG. 5 may be performed using fixed-point arithmetic with a single cycle, rather than expensive floating-point operations, thus enabling the compression to be carried out with less area, power and latency. Furthermore, clustering the mantissa values with a relatively small range of values (e.g., greater than or equal to 1, but less than 2) may also reduce the number of iterations that need to be performed to determine a suitable set of cluster centroids. Thus, in contrast to clustering floating-point values that have a larger dynamic range, clustering the fixed-point mantissa values with a limited range may even further reduce the compression time.

Figure 6:
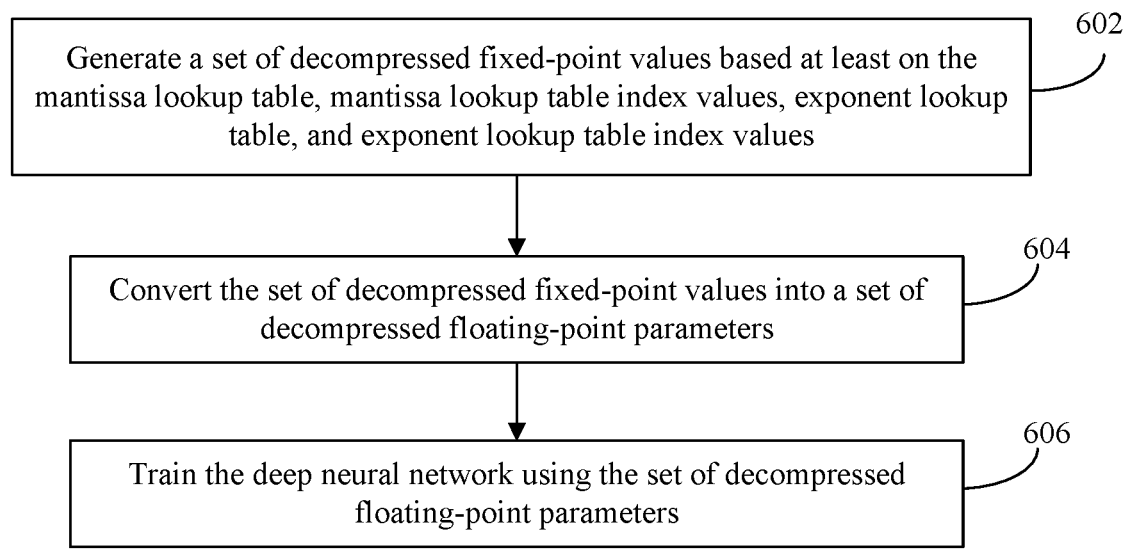
FIG. 6 shows a flowchart of a method for training a DNN using a set of decompressed floating-point numbers, according to an example embodiment.

As described above, in examples, accelerators 112 may obtained compressed parameter values to train machine-learning engine 104. For instance, FIG. 6 shows a flowchart of a method for training a DNN using a set of decompressed floating-point numbers, according to an example embodiment. In an example, the method of flowchart 600 may be implemented by accelerators 112, as shown in FIG. 3. Other structural and operational implementations will be apparent to persons skilled in the relevant art(s) based on the following discussion regarding flowchart 600 and system 300.

Flowchart 600 begins with step 602. In step 602, a set of decompressed fixed-point values is generated based at least on the mantissa lookup table, the mantissa lookup table index values, the exponent lookup table, and the exponent lookup table index values. For instance, with reference to FIG. 3, as discussed earlier, accelerators 112 may be configured to receive mantissa LUT 308, mantissa index value set 310, exponent LUT 318, and exponent value set 320 from compressed parameter communicator 312. Accelerators 112 may use the received sets of data to decompress or reconstruct parameter values that originated from weights 324. For instance, with respect to each mantissa value, accelerators 112 may identify the $\log_2(K)$-bit MLUT index value corresponding to the parameter from mantissa index value set 310, and look up the corresponding cluster centroid from the K-entry mantissa LUT 308 based on the $\log_2(K)$-bit MLUT index value. Similarly, for the exponent value, accelerators 112 may identify the $\log_2(h\_ew)$-bit exponent index value corresponding to the parameter from exponent index value set 320, and look up the corresponding exponent value from the h_ew-entry exponent LUT 318. In examples, the decompression may be performed for each parameter's mantissa and exponent values, thereby resulting in a set of decompressed fixed-point values (i.e., fixed-point mantissa and exponent values).

In examples, a compression ratio may be determined as $32/(\log_2(h\_ew)+\log_2(K))$, where 32 represents the number of floating-point bits before compression (e.g., 32 bits for the FP32 format). For many machine-learning models, including many DNNs, h_ew may be between 8 to 16, while K may be as small as 4. With such models, a compression ratio of around 5.3× to 6.4× may be achieved, with a relatively small amount of loss. For instance, when analyzing the mean square error (MSE) based on a comparison of distance between an original value and a decompressed value in accordance with implementations described herein, it was observed that the MSE was less than compared with other techniques in which floating-point values were compressed as a whole. Because of a smaller MSE, less data degradation may occur when training machine-learning model 104, thereby rendering the training more efficient.

In step 604, the set of decompressed fixed-point values may be converted into a set of decompressed floating-point parameters. For instance, with reference to FIG. 3, accelerators 302 may be configured to convert each parameter's mantissa and exponent values into a floating-point parameter. Such a conversion may be carried out, for instance, by combining the mantissa cluster centroid and the decoded exponent value corresponding to the parameter. In some examples, the floating-point parameter may comprise the same format in which weights 324 are stored, such as an FP32 where ew represents the 8-bit exponent portion of the FP32 parameter, while the mantissa cluster centroid represents the 23-bit mantissa portion of the FP32 parameter. In some implementations, the signed bit of the FP32 parameter may also be provided by compressed parameter communicator 312 as part of mantissa LUT 308, mantissa index value set 310, exponent LUT 318, exponent index value set 320, or through a separate matrix or matrices comprising each parameter's respective signed bit.

In step 606, the deep neural network is trained using the set of decompressed floating-point parameters. For instance, accelerators 112 may be configured to train machine-learning model 104 using a suitable training algorithm as described herein, such as by processing the decompressed floating-point parameters through machine-learning model to determine a gradient, which may then be back propagated until a desired error level is achieved.

It is noted and understood, however, that accelerators 112 need not decompress the parameters in all instances. For example, depending on the training algorithm, accelerators 112 may be configured to perform certain operations (e.g., homomorphic operations or the like) using the compressed set of parameters. In such a scenario, accelerators 112 may be enabled to operate even more efficiently, as decompression need not occur.

It is also noted that any of the components, subcomponents, and/or steps illustrated and/or described with reference to FIGS. 1-6 may be implemented in hardware using appropriate circuitry, as appreciated by those skilled in the relevant arts. For instance, any one or more of floating-point number separator 302, mantissa compressor 306, exponent encoder 316, compressed parameter communicator 312, or parameter updater 322 may be implementing using one or more circuits, such as a floating-point number separator circuit, a mantissa compressor circuit, an exponent encoder circuit, a compressed parameter outputting circuit, and a parameter updater circuit.

III. Example Computer System Implementation

One or more of the components of parameter memory 102, machine learning model 104, parameter server 106, parameter compression system 108, accelerators 110A-110N, floating-point number separator 302, mantissa value set 304, mantissa compressor 306, mantissa LUT 308, mantissa index value set 310, compressed parameter communicator 312, exponent value set 314, exponent encoder 316, exponent LUT 318, exponent index value set 320, parameter updater 322, weights 324, gradients 326, and one or more steps of flowcharts 200, 400, and 600 may be implemented in hardware, or hardware combined with software and/or firmware. For example, one or more of the components of parameter memory 102, machine learning model 104, parameter server 106, parameter compression system 108, accelerators 110A-110N, floating-point number separator 302, mantissa value set 304, mantissa compressor 306, mantissa LUT 308, mantissa index value set 310, compressed parameter communicator 312, exponent value set 314, exponent encoder 316, exponent LUT 318, exponent index value set 320, parameter updater 322, weights 324, gradients 326, and one or more steps of flowcharts 200, 400, and 600 may be implemented as computer program code/instructions configured to be executed in one or more processors and stored in a computer readable storage medium.

In another implementation, one or more of the components of parameter memory 102, machine learning model 104, parameter server 106, parameter compression system 108, accelerators 110A-110N, floating-point number separator 302, mantissa value set 304, mantissa compressor 306, mantissa LUT 308, mantissa index value set 310, compressed parameter communicator 312, exponent value set 314, exponent encoder 316, exponent LUT 318, exponent index value set 320, parameter updater 322, weights 324, gradients 326, and one or more steps of flowcharts 200, 400, and 600 may also be implemented in hardware that operates software as a service (SaaS) or platform as a service (PaaS). Alternatively, one or more of the components of parameter memory 102, machine learning model 104, parameter server 106, parameter compression system 108, accelerators 110A-110N, floating-point number separator 302, mantissa value set 304, mantissa compressor 306, mantissa LUT 308, mantissa index value set 310, compressed parameter communicator 312, exponent value set 314, exponent encoder 316, exponent LUT 318, exponent index value set 320, parameter updater 322, weights 324, gradients 326, and one or more steps of flowcharts 200, 400, and 600 may be implemented as hardware logic/electrical circuitry.

For instance, in an implementation, one or more of the components of parameter memory 102, machine learning model 104, parameter server 106, parameter compression system 108, accelerators 110A-110N, floating-point number separator 302, mantissa value set 304, mantissa compressor 306, mantissa LUT 308, mantissa index value set 310, compressed parameter communicator 312, exponent value set 314, exponent encoder 316, exponent LUT 318, exponent index value set 320, parameter updater 322, weights 324, gradients 326, and one or more steps of flowcharts 200, 400, and 600 may be implemented together in a system on a chip (SoC). The SoC may include an integrated circuit chip that includes one or more of a processor (e.g., a central processing unit (CPU), microcontroller, microprocessor, digital signal processor (DSP), etc.), memory, one or more communication interfaces, and/or further circuits, and may optionally execute received program code and/or include embedded firmware to perform functions.

Figure 7:
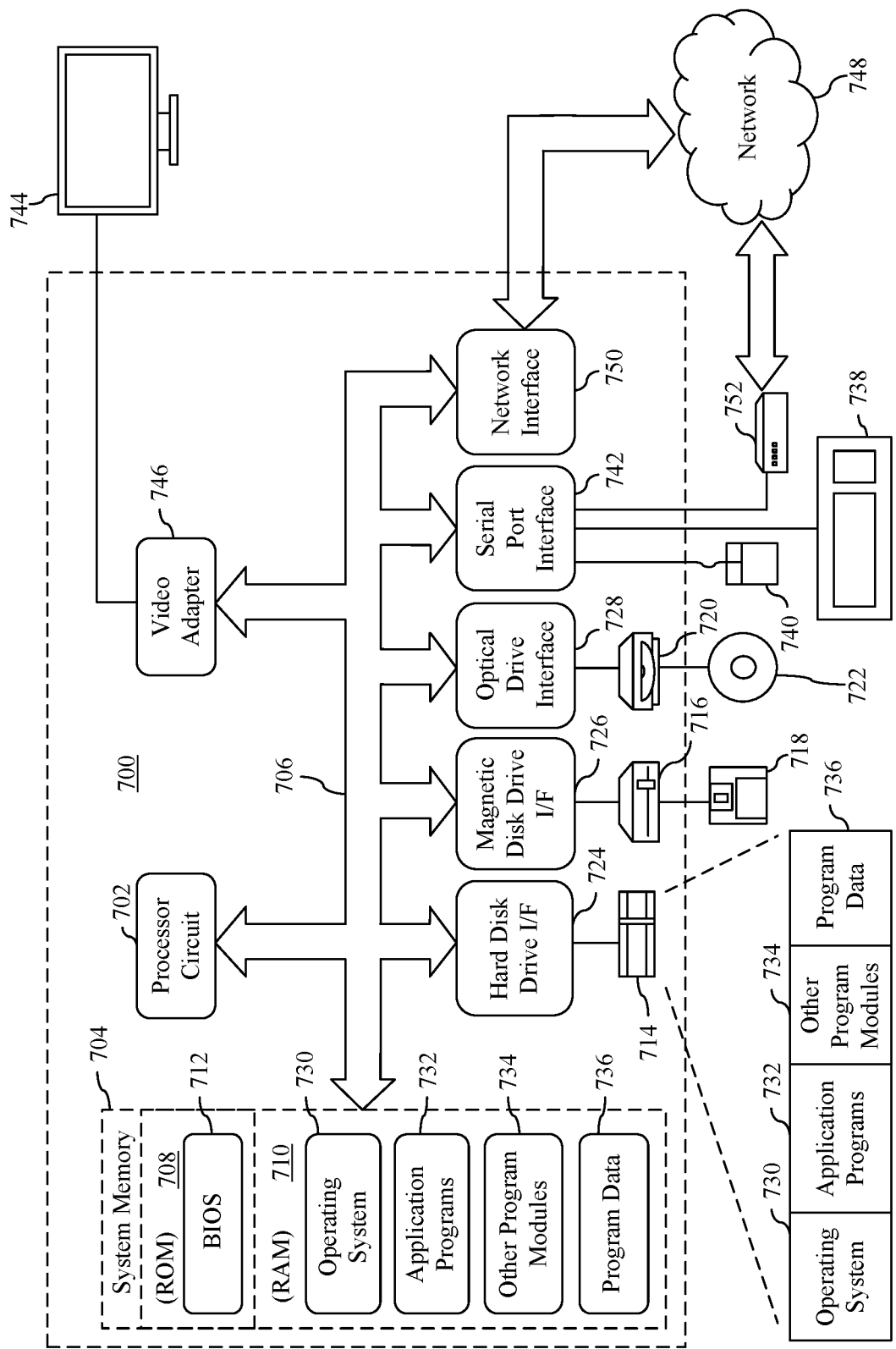
FIG. 7 is a block diagram of an example processor-based computer system that may be used to implement various example embodiments.

FIG. 7 depicts an implementation of a computing device 700 in which example embodiments may be implemented. For example, parameter memory 102, machine learning model 104, parameter server 106, parameter compression system 108, accelerators 110A-110N, floating-point number separator 302, mantissa value set 304, mantissa compressor 306, mantissa LUT 308, mantissa index value set 310, compressed parameter communicator 312, exponent value set 314, exponent encoder 316, exponent LUT 318, exponent index value set 320, parameter updater 322, weights 324, and/or gradients 326 may each be implemented in one or more computing devices similar to computing device 700 in stationary or mobile computer implementations, including one or more features of computing device 700 and/or alternative features. The description of computing device 700 provided herein is provided for purposes of illustration, and is not intended to be limiting. Example embodiments may be implemented in further types of computer systems, as would be known to persons skilled in the relevant art(s).

As shown in FIG. 7, computing device 700 includes one or more processors, referred to as processor circuit 702, a system memory 704, and a bus 706 that couple various system components including system memory 704 to processor circuit 702. Processor circuit 702 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor circuit 702 may execute program code stored in a computer readable medium, such as program code of operating system 730, application programs 732, other programs 734, etc. Bus 706 represents one or more of any of several types of bus structures, including a memory bus or memory controller, a peripheral bus, an accelerated graphics port, and a processor or local bus using any of a variety of bus architectures. System memory 704 includes read only memory (ROM) 708 and random-access memory (RAM) 710. A basic input/output system 712 (BIOS) is stored in ROM 708.

Computing device 700 also has one or more of the following drives: a hard disk drive 714 for reading from and writing to a hard disk, a magnetic disk drive 716 for reading from or writing to a removable magnetic disk 718, and an optical disk drive 720 for reading from or writing to a removable optical disk 722 such as a CD ROM, DVD ROM, or other optical media. Hard disk drive 714, magnetic disk drive 716, and optical disk drive 720 are connected to bus 706 by a hard disk drive interface 724, a magnetic disk drive interface 726, and an optical drive interface 728, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMs, ROMs, and other hardware storage media.

A number of program modules may be stored on the hard disk, magnetic disk, optical disk, ROM, or RAM. These programs include operating system 730, one or more application programs 732, other programs 734, and program data 736. Application programs 732 or other programs 734 may include, for example, computer program logic (e.g., computer program code or instructions) for implementing one or more of the components of parameter memory 102, machine learning model 104, parameter server 106, parameter compression system 108, accelerators 110A-110N, floating-point number separator 302, mantissa value set 304, mantissa compressor 306, mantissa LUT 308, mantissa index value set 310, compressed parameter communicator 312, exponent value set 314, exponent encoder 316, exponent LUT 318, exponent index value set 320, parameter updater 322, weights 324, gradients 326, and one or more steps of flowcharts 200, 400, and 600 and/or further implementations described herein.

A user may enter commands and information into the computing device 700 through input devices such as keyboard 738 and pointing device 740. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor circuit 702 through a serial port interface 742 that is coupled to bus 706, but may be connected by other interfaces, such as a parallel port, game port, or a universal serial bus (USB).

A display screen 744 is also connected to bus 706 via an interface, such as a video adapter 746. Display screen 744 may be external to, or incorporated in computing device 700. Display screen 744 may display information, as well as being a user interface for receiving user commands and/or other information (e.g., by touch, finger gestures, virtual keyboard, stylus, pen, pointing device, etc.). In addition to display screen 744, computing device 700 may include other peripheral output devices (not shown) such as speakers and printers.

Computing device 700 is connected to a network 748 (e.g., the Internet) through an adaptor or network interface 750, a modem 752, or other means for establishing communications over the network. Modem 752, which may be internal or external, may be connected to bus 706 via serial port interface 742, as shown in FIG. 7, or may be connected to bus 706 using another interface type, including a parallel interface.

As used herein, the terms "computer program medium," "computer-readable medium," and "computer-readable storage medium" are used to refer to physical hardware media such as the hard disk associated with hard disk drive 714, removable magnetic disk 718, removable optical disk 722, other physical hardware media such as RAMs, ROMs, flash memory cards, digital video disks, zip disks, MEMs, nanotechnology-based storage devices, and further types of physical/tangible hardware storage media. Such computer-readable storage media are distinguished from and non-overlapping with communication media (do not include communication media).

Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Implementations are also directed to such communication media that are separate and non-overlapping with implementations directed to computer-readable storage media.

As noted above, computer programs and modules (including application programs 732 and other programs 734) may be stored on the hard disk, magnetic disk, optical disk, ROM, RAM, or other hardware storage medium. Such computer programs may also be received via network interface 750, serial port interface 742, or any other interface type. Such computer programs, when executed or loaded by an application, enable computing device 700 to implement features of example embodiments discussed herein. Accordingly, such computer programs represent controllers of the computing device 700.

Implementations are also directed to computer program products comprising computer code or instructions stored on any computer-readable medium. Such computer program products include hard disk drives, optical disk drives, memory device packages, portable memory sticks, memory cards, and other types of physical storage hardware.

IV. Additional Example Embodiments

A system for compressing values is disclosed herein. The system includes: one or more processors; and one or more memory devices that store program code configured to be executed by the one or more processors, the program code comprising: a floating-point number separator configured to: obtain a plurality of parameters from a parameter memory, each parameter comprising a floating-point number that is used in a relationship between artificial neurons or nodes in a model; extract a mantissa value and an exponent value from each floating-point number to generate a set of mantissa values and a set of exponent values; a mantissa compressor configured to compress the set of mantissa values to generate a mantissa lookup table and a plurality of mantissa lookup table index values, each parameter being assigned one of the plurality of mantissa lookup table index values; an exponent encoder configured to encode the set of exponent values to generate an exponent lookup table and a plurality of exponent lookup table index values, each parameter being assigned one of the plurality of exponent lookup table index values; and a compressed parameter communicator configured to provide the mantissa lookup table, mantissa lookup table index values, exponent lookup table, and exponent lookup table values to at least one processing entity to train the model.

In one implementation of the foregoing system, the at least one processing entity comprises at least one hardware accelerator, and the model comprises a deep-neural network.

In another implementation of the foregoing system, the at least one processing entity is configured to: generate a set of decompressed fixed-point values based at least on the mantissa lookup table, the mantissa lookup table index values, the exponent lookup table, and the exponent lookup table index values; convert the set of decompressed fixed-point values into a set of decompressed floating-point parameters; and train the deep neural network using the set of decompressed floating-point parameters.

In another implementation of the foregoing system, the mantissa compressor is configured to compress the set of mantissa values to generate the mantissa lookup table by: partitioning the set of mantissa values into a plurality of mantissa clusters, each cluster comprising a fixed-point cluster centroid; and populating the mantissa lookup table with the fixed-point cluster centroids, each mantissa lookup table index value identifying a particular one of the fixed-point cluster centroids.

In another implementation of the foregoing system, the encoded set of exponent values is lossless.

In another implementation of the foregoing system, the mantissa compressor is configured to compress the set of mantissa values in parallel with the exponent encoder encoding the set of exponent values.

In another implementation of the foregoing system, each floating-point number is one of a single-precision floating-point number or a double-precision floating-point number.

A method for compressing values is disclosed herein. The method includes: obtaining a plurality of parameters from a parameter memory, each parameter comprising a floating-point number that is used in a relationship between artificial neurons or nodes in a model; extracting a mantissa value and an exponent value from each floating-point number to generate a set of mantissa values and a set of exponent values; compressing the set of mantissa values to generate a mantissa lookup table and a plurality of mantissa lookup table index values, each parameter being assigned one of the plurality of mantissa lookup table index values; encoding the set of exponent values to generate an exponent lookup table and a plurality of exponent lookup table index values, each parameter being assigned one of the plurality of exponent lookup table index values; and providing the mantissa lookup table, mantissa lookup table index values, exponent lookup table, and exponent lookup table values to at least one processing entity to train the model.

In one implementation of the foregoing method, the at least one processing entity comprises at least one hardware accelerator, and the model comprises a deep-neural network.

In another implementation of the foregoing method, the method further includes: generating a set of decompressed fixed-point values based at least on the mantissa lookup table, the mantissa lookup table index values, the exponent lookup table, and the exponent lookup table index values; converting the set of decompressed fixed-point values into a set of decompressed floating-point parameters; and training the deep neural network using the set of decompressed floating-point parameters.

In another implementation of the foregoing method, the compressing the set of mantissa values to generate the mantissa lookup table comprises: partitioning the set of mantissa values into a plurality of mantissa clusters, each cluster comprising a fixed-point cluster centroid; and populating the mantissa lookup table with the fixed-point cluster centroids, each mantissa lookup table index value identifying a particular one of the fixed-point cluster centroids.

In another implementation of the foregoing method, the encoded set of exponent values is lossless.

In another implementation of the foregoing method, the compressing the set of mantissa values is performed in parallel with the encoding the set of exponent values.

In another implementation of the foregoing method, each floating-point number is one of a single-precision floating-point number or a double-precision floating-point number.

A device is disclosed herein. The device includes a floating-point number separator circuit configured to: obtain a plurality of parameters from a parameter memory, each parameter comprising a floating-point number that is used in a relationship between artificial neurons or nodes in a model; and extract a mantissa value and an exponent value from each floating-point number to generate a set of mantissa values and a set of exponent values; a mantissa compressor circuit configured to compress the set of mantissa values to generate a mantissa lookup table and a plurality of mantissa lookup table index values, each parameter being assigned one of the plurality of mantissa lookup table index values; an exponent encoder circuit configured to encode the set of exponent values to generate an exponent lookup table and a plurality of exponent lookup table index values, each parameter being assigned one of the plurality of exponent lookup table index values; and a compressed parameter outputting circuit configured to output the mantissa lookup table, mantissa lookup table index values, exponent lookup table, and exponent lookup table values for use by at least one processing entity to train the model.

In one implementation of the foregoing device, the at least one processing entity comprises at least one hardware accelerator, and the model comprises a deep-neural network.

In another implementation of the foregoing device, the at least one processing entity comprises circuitry configured to: generate a set of decompressed fixed-point values based at least on the mantissa lookup table, the mantissa lookup table index values, the exponent lookup table, and the exponent lookup table index values; convert the set of decompressed fixed-point values into a set of decompressed floating-point parameters; and train the deep neural network using the set of decompressed floating-point parameters.

In another implementation of the foregoing device, the mantissa compressor circuit is configured to: partition the set of mantissa values into a plurality of mantissa clusters, each cluster comprising a fixed-point cluster centroid; and populate the mantissa lookup table with the fixed-point cluster centroids, each mantissa lookup table index value identifying a particular one of the fixed-point cluster centroids.

In another implementation of the foregoing device, the encoded set of exponent values is lossless.

In another implementation of the foregoing device, the mantissa compressor circuit is configured to compress the set of mantissa values in parallel with the exponent encoder circuit encoding the set of exponent values.

V. Conclusion

While various example embodiments have been described above, it should be understood that they have been presented by way of example only, and not limitation. It will be understood by those skilled in the relevant art(s) that various changes in form and details may be made therein without departing from the spirit and scope of the embodiments as defined in the appended claims. Accordingly, the breadth and scope of the present invention should not be limited by any of the above-described example embodiments, but should be defined only in accordance with the following claims and their equivalents.

What is claimed is:

1. A system for compressing values, comprising:
one or more processors; and
one or more memory devices that store program code configured to be executed by the one or more processors, the program code comprising:
    a floating-point number separator configured to:
        obtain a plurality of parameters from a parameter memory, each parameter comprising a floating-point number that is used in a relationship between artificial neurons or nodes in a model;
        extract a mantissa value and an exponent value from each floating-point number to generate a set of mantissa values and a set of exponent values;
    a mantissa compressor configured to compress the set of mantissa values to generate a mantissa lookup table and a plurality of mantissa lookup table index values, each parameter being assigned one of the plurality of mantissa lookup table index values;
    an exponent encoder configured to encode the set of exponent values to generate an exponent lookup table and a plurality of exponent lookup table index values, each parameter being assigned one of the plurality of exponent lookup table index values; and a compressed parameter communicator configured to provide the mantissa lookup table, mantissa lookup table index values, exponent lookup table, and exponent lookup table values to at least one processing entity to train the model.

2. The system of claim 1, wherein the at least one processing entity comprises at least one hardware accelerator, and
wherein the model comprises a deep-neural network.

3. The system of claim 2, wherein the at least one processing entity is configured to:
generate a set of decompressed fixed-point values based at least on the mantissa lookup table, the mantissa lookup table index values, the exponent lookup table, and the exponent lookup table index values;
convert the set of decompressed fixed-point values into a set of decompressed floating-point parameters; and
train the deep neural network using the set of decompressed floating-point parameters.

4. The system of claim 1, wherein the mantissa compressor is configured to compress the set of mantissa values to generate the mantissa lookup table by:
partitioning the set of mantissa values into a plurality of mantissa clusters, each cluster comprising a fixed-point cluster centroid; and
populating the mantissa lookup table with the fixed-point cluster centroids, each mantissa lookup table index value identifying a particular one of the fixed-point cluster centroids.

5. The system of claim 1, wherein the encoded set of exponent values is lossless.

6. The system of claim 1, wherein the mantissa compressor is configured to compress the set of mantissa values in parallel with the exponent encoder encoding the set of exponent values.

7. The system of claim 1, wherein each floating-point number is one of a single-precision floating-point number or a double-precision floating-point number.

8. A method for compressing values, comprising:
obtaining a plurality of parameters from a parameter memory, each parameter comprising a floating-point number that is used in a relationship between artificial neurons or nodes in a model;
extracting a mantissa value and an exponent value from each floating-point number to generate a set of mantissa values and a set of exponent values;
compressing the set of mantissa values to generate a mantissa lookup table and a plurality of mantissa lookup table index values, each parameter being assigned one of the plurality of mantissa lookup table index values;
encoding the set of exponent values to generate an exponent lookup table and a plurality of exponent lookup table index values, each parameter being assigned one of the plurality of exponent lookup table index values; and
providing the mantissa lookup table, mantissa lookup table index values, exponent lookup table, and exponent lookup table values to at least one processing entity to train the model.

9. The method of claim 8, wherein the at least one processing entity comprises at least one hardware accelerator, and
wherein the model comprises a deep-neural network.

10. The method of claim 9, further comprising:
generating a set of decompressed fixed-point values based at least on the mantissa lookup table, the mantissa lookup table index values, the exponent lookup table, and the exponent lookup table index values;
converting the set of decompressed fixed-point values into a set of decompressed floating-point parameters; and
training the deep neural network using the set of decompressed floating-point parameters.

11. The method of claim 8, wherein the compressing the set of mantissa values to generate the mantissa lookup table comprises:
partitioning the set of mantissa values into a plurality of mantissa clusters, each cluster comprising a fixed-point cluster centroid; and
populating the mantissa lookup table with the fixed-point cluster centroids, each mantissa lookup table index value identifying a particular one of the fixed-point cluster centroids.

12. The method of claim 8, wherein the encoded set of exponent values is lossless.

13. The method of claim 8, wherein the compressing the set of mantissa values is performed in parallel with the encoding the set of exponent values.

14. The method of claim 8, wherein each floating-point number is one of a single-precision floating-point number or a double-precision floating-point number.

15. A device comprising:
a floating-point number separator circuit configured to:
obtain a plurality of parameters from a parameter memory, each parameter comprising a floating-point number that is used in a relationship between artificial neurons or nodes in a model; and
extract a mantissa value and an exponent value from each floating-point number to generate a set of mantissa values and a set of exponent values;
a mantissa compressor circuit configured to compress the set of mantissa values to generate a mantissa lookup table and a plurality of mantissa lookup table index values, each parameter being assigned one of the plurality of mantissa lookup table index values;
an exponent encoder circuit configured to encode the set of exponent values to generate an exponent lookup table and a plurality of exponent lookup table index values, each parameter being assigned one of the plurality of exponent lookup table index values; and
a compressed parameter outputting circuit configured to output the mantissa lookup table, mantissa lookup table index values, exponent lookup table, and exponent lookup table values for use by at least one processing entity to train the model.

16. The device of claim 15, wherein the at least one processing entity comprises at least one hardware accelerator, and
wherein the model comprises a deep-neural network.

17. The device of claim 16, wherein the at least one processing entity comprises circuitry configured to:
generate a set of decompressed fixed-point values based at least on the mantissa lookup table, the mantissa lookup table index values, the exponent lookup table, and the exponent lookup table index values;
convert the set of decompressed fixed-point values into a set of decompressed floating-point parameters; and
train the deep neural network using the set of decompressed floating-point parameters.

18. The device of claim 15, wherein the mantissa compressor circuit is configured to:
partition the set of mantissa values into a plurality of mantissa clusters, each cluster comprising a fixed-point cluster centroid; and populate the mantissa lookup table with the fixed-point cluster centroids, each mantissa lookup table index value identifying a particular one of the fixed-point cluster centroids.

19. The device of claim 15, wherein the encoded set of exponent values is lossless.

20. The device of claim 15, wherein the mantissa compressor circuit is configured to compress the set of mantissa values in parallel with the exponent encoder circuit encoding the set of exponent values.

* * * * *